United States Patent [19]

Baldwin et al.

[11] Patent Number: 5,200,699

[45] Date of Patent: Apr. 6, 1993

[54] EVALUATION OF LIQUID-CONTAINING SAMPLES USING NUCLEAR MAGNETIC RESONANCE

[75] Inventors: Bernard A. Baldwin; Stephen M. Wharry, both of Bartlesville, Okla.

[73] Assignee: Phillips Petroleum Company, Bartlesville, Okla.

[21] Appl. No.: 765,631

[22] Filed: Sep. 25, 1991

[51] Int. Cl.$^5$ .............................................. G01R 33/20
[52] U.S. Cl. .................................................... 324/303
[58] Field of Search ............... 324/300, 303, 307, 318, 324/322

[56] References Cited

U.S. PATENT DOCUMENTS

| | | | |
|---|---|---|---|
| 3,508,438 | 4/1970 | Alger et al. | 73/152 |
| 4,413,512 | 11/1983 | Zemanek, Jr. | 73/152 |
| 4,701,708 | 10/1987 | Hardy et al. | 324/311 |
| 4,706,024 | 11/1987 | Dumoulin | 324/309 |
| 4,868,500 | 9/1989 | Baldwin et al. | 324/307 |
| 5,049,820 | 9/1991 | Briand et al. | 324/309 |

OTHER PUBLICATIONS

Zemanek, J. "Low-Resistivity Hydrocarbon-Bearing Sand Reservoirs", *Society of Petroleum Engineers*, SPE 15713 (1987), pp. 185-197.
Givens, W. W. "A Conductive Rock Matrix Model (CRMM) for the Analysis of Low-Contrast Resistivity Formations", *The Log Analyst* (Mar.-Apr. 1987), pp. 138-151.
Kenyon, W. E. et al. "A Three-Part Study of NMR Longitudinal Relaxation Properties of Water-Saturated Sandstones", *SPE Formation Evaluation* (Sep. 1988), pp. 622-636.
Gallegos, D. P. et al. "A NMR Technique for the Analysis of Pore Structure: Application to Materials with Well-Defined Pore Structure", *Journal of Colloid and Interface Science*, vol. 119, No. 1 (Sep. 1987), pp. 127-140.
Timur, A.: "Pulsed Nuclear Magnetic Resonance Studies of Porosity, Movable Fluid, and Permeability of Sandstones", *Journal of Petroleum Technology* (Jun. 1969), pp. 775-786.
Shaw, D. *Fourier Transform N. M. R. Spectroscopy*, Amsterdam, Elsevier Scientific Publishing Company, 1976, pp. 323-325.

*Primary Examiner*—Michael J. Tokar
*Attorney, Agent, or Firm*—William R. Sharp

[57] ABSTRACT

A method is provided for evaluating the potential productivity of a zone of a formation in regard to hydrocarbons substantially free of water, and according to another aspect the method can determine the residual saturation of any porous media with respect to any particular saturating liquid. At least one sample from a zone is saturated with a saturating liquid, such as a saturating liquid comprising water, and the nuclear magnetization of the liquid is substantially inverted by means of at least one NMR radio frequency pulse. A component of the nuclear magnetization is detected at different delay times following application of such a pulse, from which the delay time (NMR zero time) is determined at which the magnetization component is zero. Potential productivity of dry hydrocarbons from the zone and/or residual saturation of the core sample is determined based on the NMR zero time.

17 Claims, 4 Drawing Sheets

EVALUATION OF LIQUID-CONTAINING SAMPLES USING NUCLEAR MAGNETIC RESONANCE

BACKGROUND OF THE INVENTION

This invention relates generally to the evaluation of liquid-containing porous samples using nuclear magnetic resonance, and according to certain aspects relates to the determination of potential production characteristics of zones of a subterranean formation from which such samples are obtained.

Certain lithological types of formations, such as shaly sandstones, are highly unpredictable in their production of dry hydrocarbons, which are defined herein as hydrocarbons substantially free of water. For example, such formations having high (i.e. 50% or more) total water saturations sometimes produce dry hydrocarbons. Conversely, such formations having lower total water saturations sometimes produce primarily water and little or no hydrocarbons. Therefore, it is necessary for economic production from such formations to determine those zones of a particular formation which will produce dry hydrocarbons.

One technique for making such a determination is actual production testing of zones of the formation. This involves packing a borehole which penetrates the formation at two respective depths so as to seal off a particular zone, and then commencing production from this particular zone. The resulting product is then analyzed for its oil and water content to determine if the product is acceptably "dry". Although this is the most direct and reliable technique for determining the dry hydrocarbon producing potential of a zone of a formation, it is extremely expensive. In offshore operations, in particular, production testing of each zone can cost over $200,000. Therefore, production testing of each zone of interest in a formation can be prohibitively expensive.

Alternatives to production testing include conventional analytical techniques for determining the residual water saturation of a sample or samples from a particular zone. Although defined more specifically below, residual water saturation generally denotes that water which is immobile, and thus not producible from a formation in admixture with hydrocarbons. Once the residual saturation is known, it can be easily deduced whether or not dry hydrocarbons are producible. However, conventional analytical techniques for determining residual saturation, such as the porous plate method involving desaturation of the sample in a pressurized gas atmosphere, can take days or weeks to complete. Such lengthy analysis is neither practical nor economical.

SUMMARY OF THE INVENTION

Therefore, it is an object of the invention to provide a method of determining if a zone of a formation is potentially productive of dry hydrocarbons.

It is a further object of the invention to provide such a method which is fast and economical in the evaluation of zones of a formation.

Yet another object of the invention is to provide a method of determining the residual saturation of a sample, the results of which are useable in evaluations of zones of a formation in the manner discussed above.

Certain of the above objects are realized by a method of evaluating the potential production characteristics of a zone of a subterranean formation which extends between a first depth and a second depth, comprising: (a) obtaining at least one sample of the formation from the zone; (b) substantially saturating the sample with the saturating liquid comprising water; (c) subjecting the thus saturated sample to a static magnetic field, oriented in a first direction and along a reference frame axis, so as to substantially align the nuclear magnetization of the saturating liquid with the static magnetic field; (d) subjecting the sample during step (c) to at least one radio frequency pulse, at a resonant frequency with respect to preselected nuclei in the saturating liquid, so as to substantially invert the magnetization of such preselected nuclei to an orientation in a second direction substantially opposite to the first direction; (e) detecting, at a predetermined delay time following the radio frequency pulse of step (d), a component of the magnetization of the preselected nuclei which is parallel to the reference frame axis; (f) repeating step (d) and (e) for at least one other delay time; (g) determining, from the magnetization component values and corresponding delay times obtained in (e) and (f), the delay time at which the magnetization component is about zero, hereinafter referred to as the NMR zero time; and (h) determining if the zone is potentially productive of hydrocarbons which are substantially free of water based on the NMR zero time obtained in step (g).

According to another aspect of the invention, there is provided a method of determining the residual saturation of a sample of a porous media with respect to a saturating liquid which comprises: substantially saturating the sample with the saturating liquid; obtaining the NMR zero time as described above; and determining the residual saturation of the sample with respect to the saturating liquid based on the NMR zero time.

According to a preferred embodiment, residual saturation of a core sample from a zone is determined by employing a calibration function relating NMR zero time and residual saturation, which is then compared to the total saturation (as obtained, for example, from resistivity log measurements) associated with the zone to determine the zone's potential productivity of dry hydrocarbons.

Each sample can be typically analyzed in accordance with the invention using commerically available NMR equipment in about one hour or less. This allows very fast, and thus economical, evaluation of zones of a formation.

DETAILED DESCRIPTION OF THE INVENTION

A preferred embodiment of the invention will now be described with reference to the FIGURES. Although this embodiment pertains to the determination of potential productivity of dry hydrocarbons based on residual saturation of a core sample with respect to a saturating liquid comprising water, it should be understood that according to certain aspects of the invention residual saturation of any sample of a porous media can be determined with respect to any saturating liquid.

Several terms which are used repeatedly through the following description and in the appended claims are defined below.

The term "total saturation" with respect to a particular liquid in a porous media, such as a core sample, refers to the portion of the pore volume in the porous media which is filled with that liquid. A porous media which is fully saturated (100% total saturation) has all its pore volume filled with liquid.

The term "residual saturation" with respect to a particular liquid in a porous media refers to the portion of the pore volume in the fully saturated porous media which contains immobile, or immovably bound, liquid. Such residual saturation is sometimes called "immobile saturation" or "irreducible saturation".

The term "function" generally denotes a relationship between two parameters which can be expressed as, for example, a mathematical equation or physical curve.

The term "nuclear magnetic resonance" is herein expressed as NMR.

Figure 1:
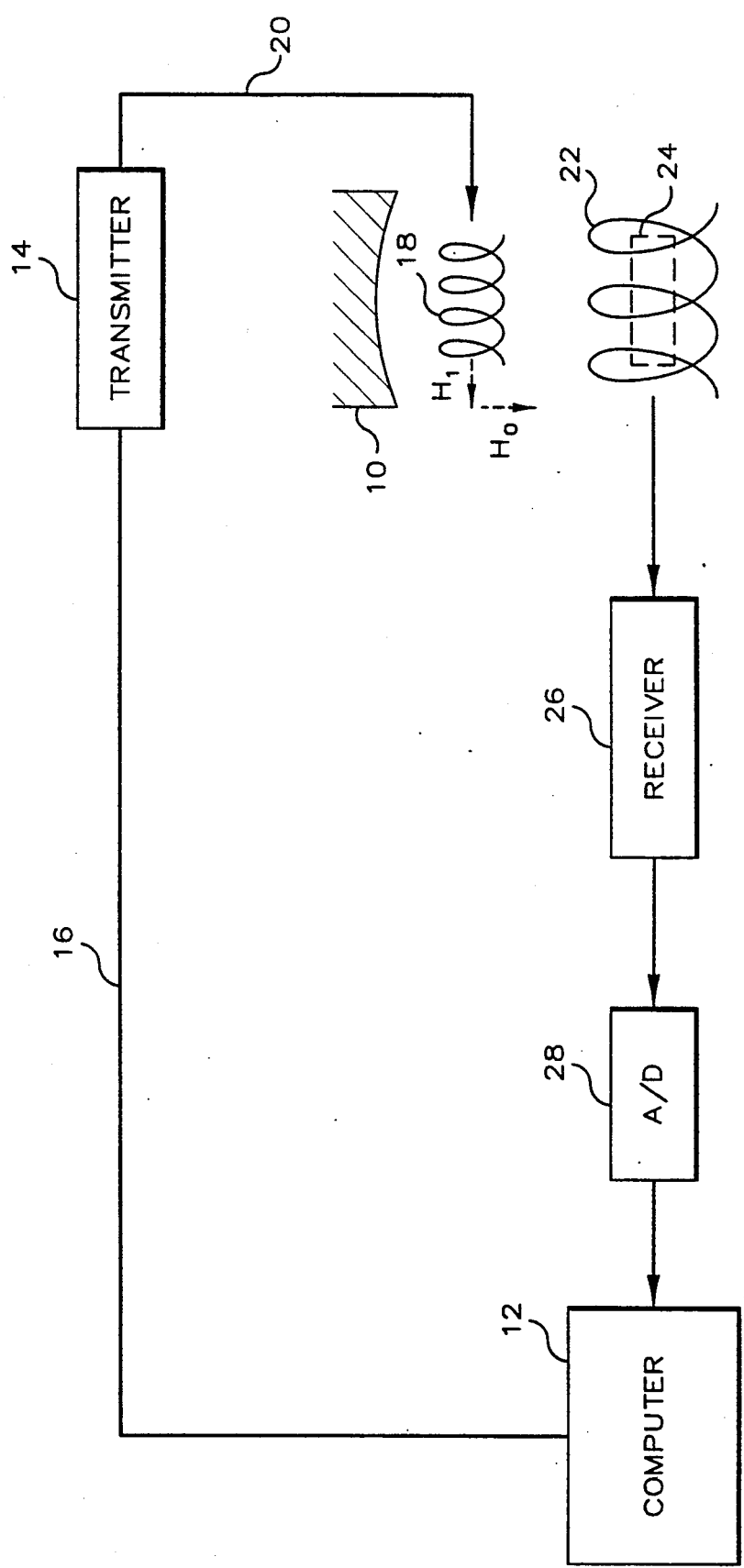
FIG. 1 is a schematic illustration of an NMR apparatus for use in the present invention.

Referring to FIG. 1, there is shown one embodiment of an apparatus which can be used to practice the invention. The apparatus includes a resistive, permanent or superconducting, magnet 10 which produces a static magnetic field $H_0$ in the indicated direction. The apparatus further includes a computer 12 which has the capability of controlling radio frequency transmitter 14 via signal line 16, and which can further have the capability to process incoming data if desired. Transmitter 14 is adapted to produce radio frequency signals at a predetermined frequency which are received by RF coil 18 via signal line 20. RF coil 18 accordingly generates a radio frequency field $H_1$ in a direction perpendicular to $H_0$ in the form of a single pulse or sequence of pulses in response to commands from suitably programmed computer 12. Also shown in FIG. 1 is a receiver coil 22 which comprises a suitable conductor, such as copper. Core sample 24 is shown as being generally coaxially positioned within receiver coil 22. Receiver coil 22 functions as an NMR detector in a manner discussed further below so as to produce at least one signal which is received by and appropriately amplified by receiver 26. The amplified signal is digitized by A/D converter 28 and fed into computer 12 for processing.

It should be also understood that the relative positions of receiver coil 22, magnet 10 and RF coil 18 are not necessarily as illustrated, but are rather depicted in FIG. 1 for clarity of illustration. Furthermore, although RF coil 18 and receiver coil 22 are shown in the illustrated embodiment as separate coils, a single coil could be provided in conjunction with a suitable switching mechanism.

A commercially available NMR system can be used for the apparatus of FIG. 1. One possible system can include the Bruker PC-20 NMR spectrometer, in which case core sample 24 can be contained in a glass tube which is appropriately positioned within receiver coil 22. Such an NMR spectrometer can be coupled with a personal computer in the manner discussed in an article entitled "Interfacing a Micro Computer and Robot to a Pulsed NMR Spectrometer" by S. M. Wharry et al, *American Laboratory* (September 1985), which is hereby incorporated by reference.

The receiver coil 22 of FIG. 1 produces at least one signal corresponding to the entire core sample 24. Such a system is suitable for smaller core samples of less than, for example, about 1 cm$^3$ in volume, but larger core samples may require a more sophisticated system having gradient coils for scanning multiple volume elements of the core sample. Signals would in that case be produced for a plurality of volume elements in the core sample which could then be averaged.

A preferred embodiment of the method of the invention will now be described in terms of its sequential steps. Not all steps need be carried out in the precise order set forth below.

1. Select Zone of Interest

Figure 2:
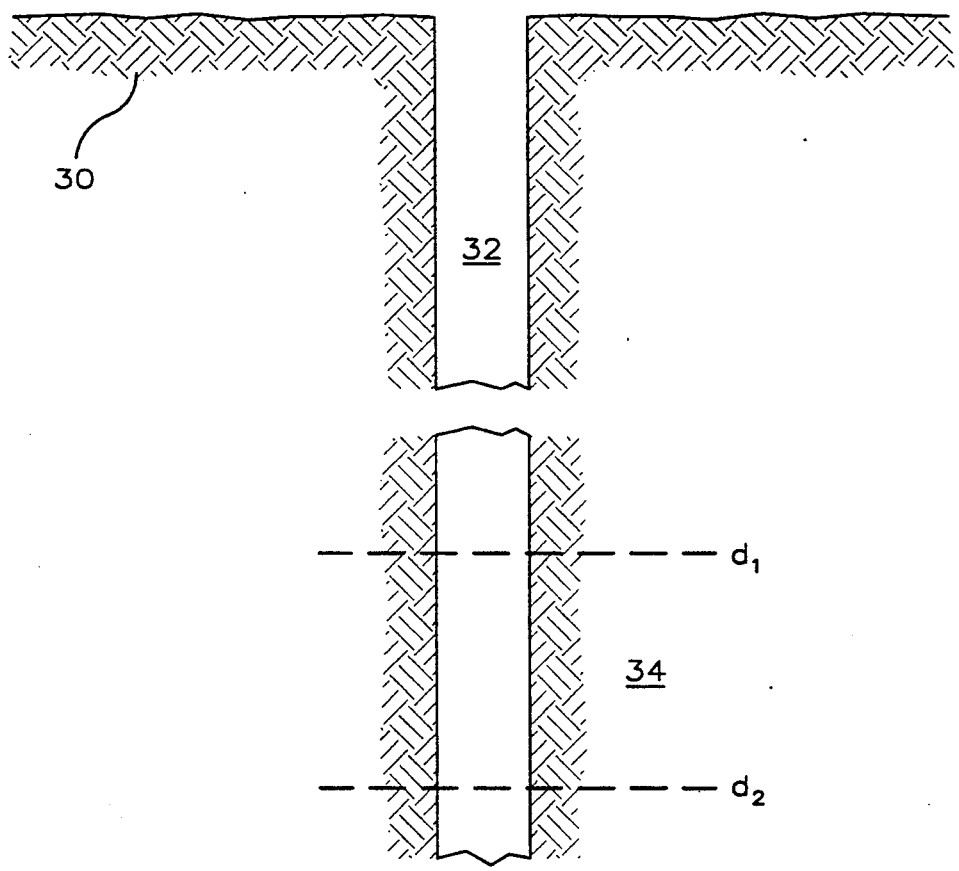
FIG. 2 is a schematic illustration of a subterranean formation and a borehole which penetrates therethrough.

Referring to FIG. 2, there is shown a schematic representation of a subterranean formation 30 having a borehole 32 penetrating therethrough. A zone 34 of the formation, extending between a first depth $d_1$ and a second depth $d_2$ is selected for evaluation in accordance with the method as hereafter described.

Such a zone 34 can be selected, for example, with the aid of resistivity log measurement taken with conventional logging equipment (not shown). A zone can be selected as potentially productive of hydrocarbons if the resistivity associated with such zone is within a predetermined range.

Although only a single zone is shown and discussed herein, in actual practice a number of zones will typically be selected for further evaluation. A particular zone can vary widely in height, from only a few feet to several hundred feet, depending on the geological characteristics of the formation and other factors.

2. Determine Total Water Saturation Associated with Zone

The total water saturation associated with the selected zone 34 can be determined in a conventional manner from the resistivity log measurements obtained above. The total water saturation is generally inversely related to the resistivity. For example, an increase in total water saturation is associated with a decrease in resistivity, and vice versa.

3. Obtain at Least One Core Sample From Zone

At least one core sample is taken from zone 34 in any suitably convenient form. A core sample is most preferably obtained from zone 34 as a sidewall core, typically about an inch in diameter and about ⅜ inch to 2 inches long, taken from the sidewall of borehole 32 by any conventional technique. Alternatively, a core sample may be in the form of a plug taken from a borehole core as extracted from borehole 32. It is also within the scope of the invention to employ any other sample, such as a drill bit cutting or fragment, from zone 34 which is of a sufficient size to enable NMR analysis thereof.

Although only a single core sample is discussed in the following description for the sake of simplicity, it is in many cases preferable to obtain a number of core samples from zone 34. For example, core samples can be taken at spaced intervals of about 1 foot to about 3 feet. In this manner and as will be more apparent below, NMR data (zero times) which is subsequently obtained for the various core samples can be averaged, or examined for possible anomalies to determine that data (zero time) most representative of the zone.

4. Clean Core Sample

The core sample is preferably cleaned to remove liquid (i.e. oil and brine) therefrom in order to allow saturation of the core sample with the desired saturating liquid in accordance with a subsequent step. The core sample can be cleaned in, for example, a combination of solvents such as methanol and toluene, respectively. A mixture of such solvents could be employed or each solvent could be used in sequence. The cleaning process involves pumping the solvents through the core sample for a predetermined number of pore volumes to flush out the core sample. After cleaning, the core sample is preferably dried in a suitable oven to remove residual solvent and then cooled in a desiccator.

5. Saturate Core Sample

The core sample is now saturated with the water-containing saturating liquid, preferably to near 100% total saturation. The saturating liquid can be fresh water or a brine comprising primarily water and a minor portion of salt dissolved therein. The saturating liquid preferably should simulate the water based liquid actually found in the subterranean formation to avoid altering the core sample.

The core sample can be saturated by any suitable technique such as the flash saturation technique. According to such a technique, the core sample is placed in a flask which is evacuated to very low pressure, followed by injection of the saturating liquid into the flask so as to immerse the core sample in the liquid. Atmospheric pressure is then restored to the flask so as to cause a sudden change in pressure and force liquid into the pores of the core sample, typically resulting in a substantially saturated state of at least 99%. The core sample can also be saturated by flowing the saturating liquid therethrough.

6. Obtain NMR Data for Core Sample

After cleaning and saturation as discussed above, the core sample is subjected to NMR analysis to obtain the desired data. Reference will be made in the following description to the apparatus of FIG. 1, and also to FIGS. 3-5 to schematically illustrate the different magnetization states of preselected nuclei, preferably hydrogen, in the water.

Figure 3:
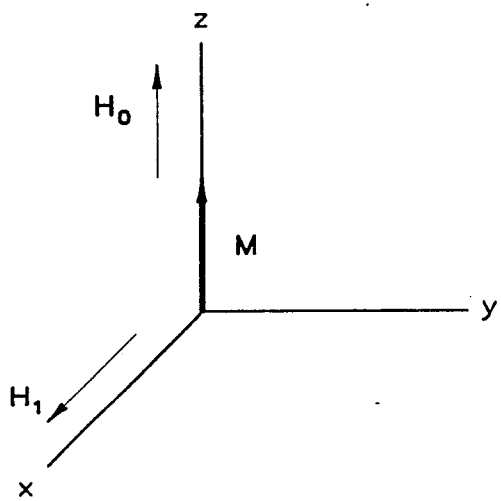
FIGS. 3-5 schematically depict the nuclear magnetization of liquid in a sample at different times, as will be described further below.
Figure 4:
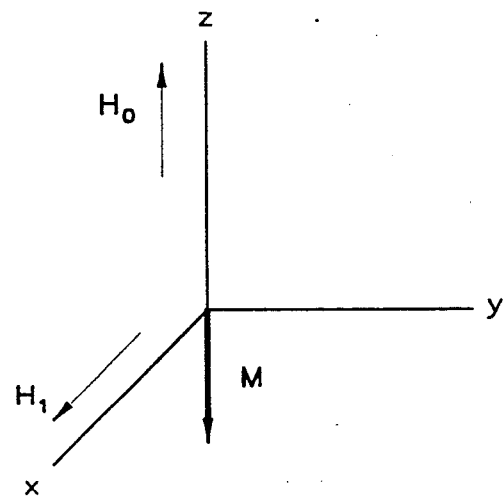
Figure 5:
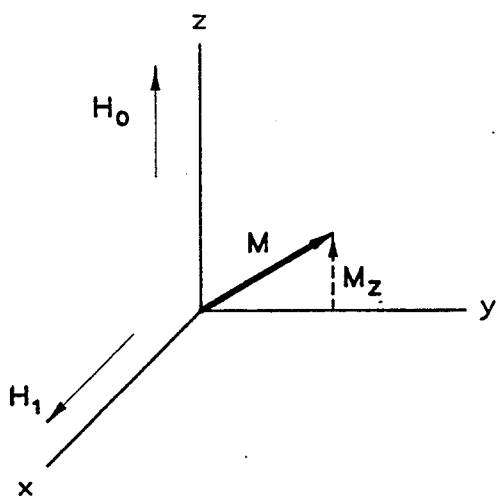

Core sample 24 is subjected to the static magnetic field $H_0$, which is oriented along a reference frame axis denoted as the z axis in FIGS. 3-5. This static magnetic field causes spinning nuclei in the saturating liquid of the core sample to align with the field such that the magnetic moment vector of each spinning nucleus precesses around the z axis at a certain precessional frequency, thereby resulting in a net magnetization M aligned with field $H_0$ as shown in FIG. 3. During application of field $H_0$ the core sample 24 is subjected to radio frequency pulsed field $H_1$ at a resonant frequency equivalent to the precessional frequency of the preselected nuclei. Such a radio frequency field comprises at least one pulse, most preferably a single 180° pulse, of sufficient amplitude and duration to invert the magnetization M to an orientation having a direction opposite to the direction of $H_0$, as shown in FIG. 4. After a certain delay time t, the magnetization M relaxes toward the equilibrium state of FIG. 3 to an orientation as shown, for example, in FIG. 5. This orientation can be anywhere between the equilibrium and inverted states of FIGS. 3 and 4, respectively, depending upon the length of the delay time t. Such delay time can range from only a fraction of a millisecond to several thousand milliseconds. Note also in FIG. 5 the z component of M, denoted as $M_z$, which is parallel to the z axis. The return of $M_z$ to equillibrium is sometimes referred to as "spin-lattice" relaxation.

The magnetization component $M_z$ as a function of delay time t for an individual nucleus, expressed in terms of a constant $M_0$, can range from $M_0$ (i.e. FIG. 3) for infinitely large t to $-M_0$ (i.e. FIG. 4) for t=0. A positive value indicates a direction of the magnetization component vector $M_z$ in the direction of the positive z axis and a negative value indicates a direction of $M_z$ in the direction of the negative z axis. Therefore, at some value of t, $M_z$ is 0.

The magnetization component $M_z$ is most conveniently detected by subjecting the core sample to a 90° pulse, also at the resonant frequency, thereby resulting in a free induction decay (FID) signal in the receiver coil 22. This signal can be digitized, and optionally Fourier transformed, to yield a processed signal having an intensity, or amplitude, representative of $M_z$ which can range from a positive maximum value representative of $M_0$ to a negative minimum value representative of $-M_0$. Detection of magnetization components in this manner and processing of NMR signals are discussed at length in a text entitled *Fourier Transform N.M.R. Spectroscopy*, by Derek Shaw, Elsevier Scientific Publishing Company, Amsterdam, 1976. Although the 90° pulse is most preferred to detect and measure the magnetization component $M_z$, any other sampling pulse capable of producing an NMR signal representative of $M_z$ is within the scope of certain aspects of the invention.

The above NMR procedure results in a magnetization component value and a corresponding delay time. After waiting a sufficient length of time to allow the nuclear magnetization to relax back to equilibrium, at least one other magnetization component value corresponding to a different delay time is obtained by repeating the above pulse sequence and associated detection. Any number of magnetization component values and corresponding delay times can be obtained by repeating the procedure in this manner with different delay times. Generally, and as will become more apparent below, obtaining more data will optimize accuracy of the method, but lengthens the procedure. The procedure can be desirably shortened in time by obtaining, to the extent possible, a minimum number of both positive and negative magnetization component values near zero intensity to ease the task of obtaining the NMR zero time in accordance with a subsequent step.

Figure 6:
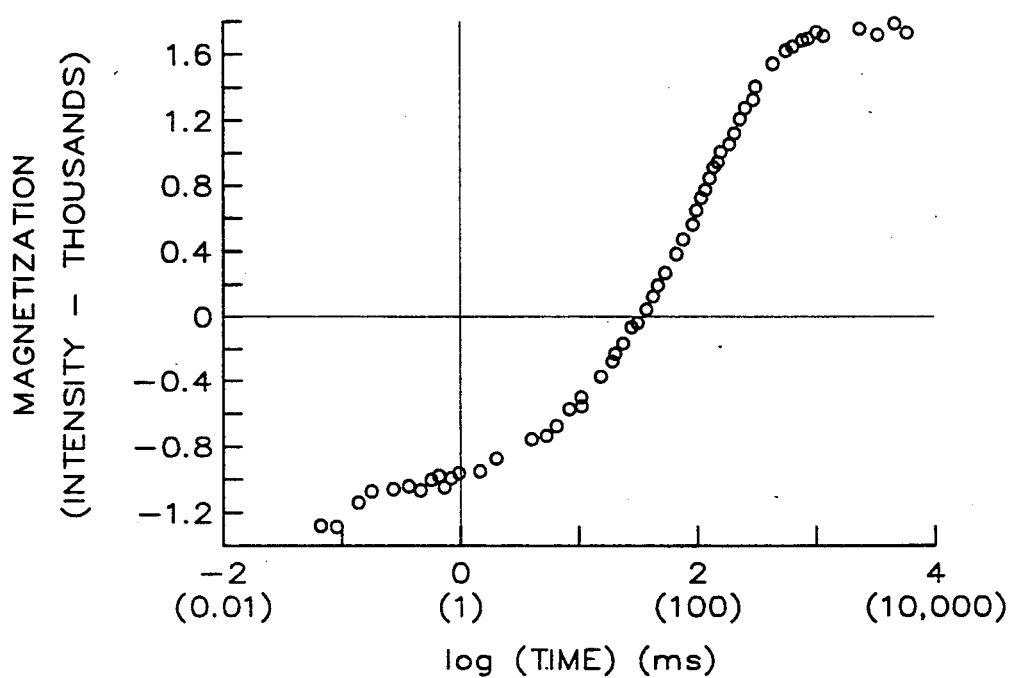
FIG. 6 is a plot of the base ten logarithm of delay time (with the delay times shown in parentheses) v. magnetization for a particular liquid-containing sample as obtained in the subsequent example. The NMR zero time can be obtained from such data.

A number of magnetization component values and corresponding logarithmically plotted delay times are plotted in FIG. 6 as an illustrative example of a set of data obtained in accordance with this step. This plotted data was obtained in accordance with a subsequent example. This data set is very extensive, and probably more so than is generally desirable. Fewer data points would suffice as long as the NMR zero time can be determined by the immediately following step with acceptable accuracy.

7. Obtain NMR Zero Time

The NMR zero time, or the delay time t at which the magnetization component $M_z$ is 0, is now determined from the magnetization component values and corresponding delay times as obtained in step 6. This can be done by fitting a function to such data or by simple interpolation as described below.

In fitting a function relating the magnetization component and delay time to the data, such a function can be obtained in the form of a mathematical equation by any suitable technique, such as least squares fitting, or such function can be obtained graphically by simply drawing the curve through the plotted data points. Once the function is fitted to the data, the NMR zero time can easily be determined from the function by simply substituting 0 as the value of the magnetization component into the equation and solving for delay time t, or by obtaining the NMR zero time directly from a graph of the data. In addition, the function can be fitted to the magnetization component values and their corresponding delay times in their raw form, or in some other form, such as logarithmic, if such form is more convenient and leads to a better fit to the data. For example, the function could be fitted to the magnetization component values and the logarithm of the delay times.

Any suitable function can be fitted to the data. If a function is fitted to a full range of data as shown in FIG. 6, a power series function could be employed, for example. It is generally preferable, however, to fit a function, most conveniently a linear function, to only a narrow range of data near the magnetization component value of 0. Such an approach minimizes the amount of data required, maximizes the speed of the procedure to determine the NMR zero time, and therefore also enhances the economics of the overall method.

In determining the NMR zero time by interpolation, no function needs to be fitted to the data. According to such a technique, one can interpolate between the delay times corresponding to the positive and negative magnetization component values closest to 0 to arrive at the NMR zero time.

8. Determine Residual Saturation

The residual saturation of the core sample with respect to the saturating liquid is now determined from the NMR zero time. Such determination is made with reference to a calibration function relating NMR zero time and residual saturation, which is obtained in a manner discussed further below. Such a calibration function preferably corresponds to the same lithological type, such as sandstone or chalk, as the zone of the formation. The residual saturation is determined from the calibration function by simply substituting the NMR zero time into a mathematical equation to yield the residual saturation, or by graphically obtaining the residual saturation corresponding to a particular NMR zero time from a plot of residual saturation v. NMR zero time.

Figure 7:
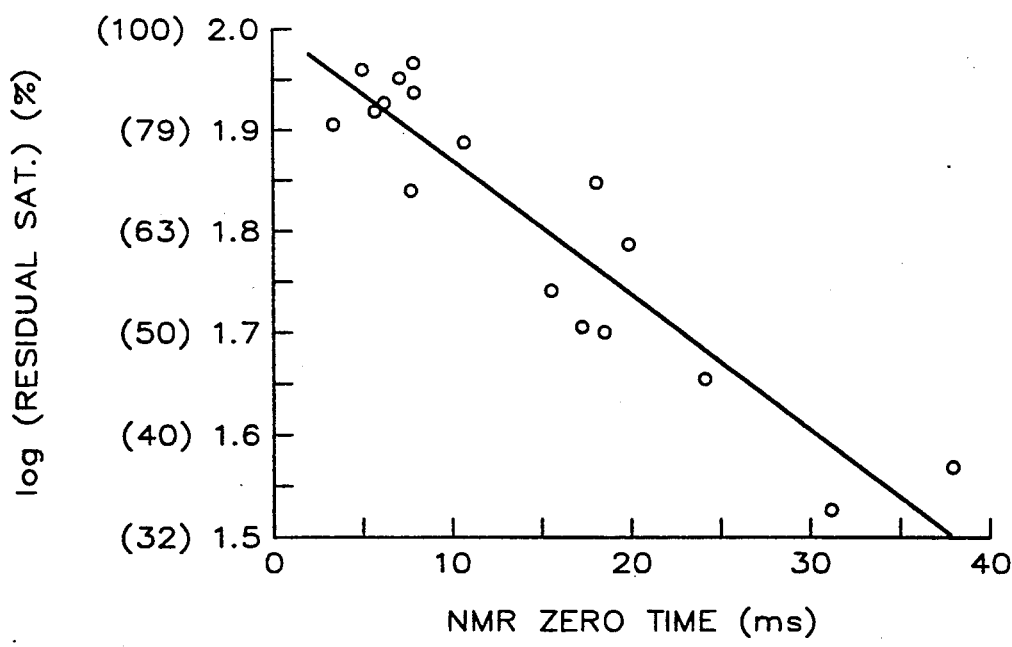
FIG. 7 is a plot of NMR zero time v. the base ten logarithm of residual saturation (with the residual saturations shown in parentheses) as obtained in a subsequent example for the purpose of determining a calibration function. A linear calibration function is shown as being fitted to such data, from which a residual saturation can be determined from a particular NMR zero time.

The calibration function, as noted above, corresponds to a particular lithological type, and therefore need not be redetermined each time the invention is applied to a particular zone, as long as the calibration function corresponding to the lithological type of such zone has been previously determined. The calibration function is obtained by determining a plurality of residual saturations and NMR zero times for a number of corresponding core samples (hereafter referred to as calibration core samples) of a particular lithological type, not necessarily from the formation to which the method of the invention will be applied, and then fitting the calibration function to the residual saturations and corresponding NMR zero times in their raw form or in a logarithimic form. Such a fitting procedure was applied to data (logarithm of residual saturations and corresponding NMR zero times) corresponding to seventeen calibration core samples of a subsequent example, as shown in FIG. 7, and resulted in an excellent linear fit to the data.

In obtaining the residual saturation and NMR zero time for each calibration core sample, the following procedure can be followed: (1) clean and dry the calibration core sample with a combination of solvents as discussed previously. (2) Determine the weight $W_1$ of the dry, substantially liquid free calibration core sample. (3) Saturate the dry calibration core sample with the saturating liquid to a saturated state near or at 100% total saturation. (4) Determine the weight $W_2$ of the saturated calibration core sample. (5) Desaturate the calibration core sample to residual saturation by any suitable technique, such as the porous plate technique wherein the calibration core sample is positioned on a porous plate and exposed to a pressurized (i.e. 150–200 psi) inert gas so as to drive the saturating liquid from the calibration core sample and through the porous plate to a suitable collector. This is continued until such time as equilibrium is reached and flow from the calibration core sample terminates, at which point residual saturation can be assumed to exist. (6) Determine the weight $W_3$ of the residually saturated calibration core sample. (7) Determine the residual saturation (in percent) of the calibration core sample from the expression $[(W_3-W_1)/(W_2-W_1)] \times 100$. (8) Determine the NMR zero time for the residually saturated calibration core sample according to the procedure described in steps 6 and 7.

9. Determine Potential Productivity of Dry Hydrocarbons

It is now determined whether or not the zone of the formation is potentially productive of dry hydrocarbons, which are substantially free of water. This is most conveniently done by comparing the total saturation as determined in step 2 to the residual saturation as determined in step 8. More specifically, the zone is determined to be potentially productive of dry hydrocarbons if the residual saturation is greater than or equal to the total saturation. This means that whatever water is present in the zone of the formation is generally immobile, and will not be expected to be produced in admixture with hydrocarbons. Once the determination of this step 9 is made, and dry hydrocarbon production is predicted, it is typical to then carry out production testing of the zone to confirm the prediction. If dry hydrocarbon production from the zone is not predicted, expensive production testing of the zone can be avoided, and further evaluation of other zones of interest can be performed.

EXAMPLE

An example will now be described to further illustrate the invention, but which should not be construed to limit the invention in any manner. The purpose of this example is to demonstrate the determination of residual saturation employing the method of the invention.

A borehole core was extracted from a formation of substantially shaly sandstone. Plugs, hereafter referred to simply as core samples, having a 1.5 inch diameter were cut from different locations along the borehole core, followed by cleaning with toluene and methanol in the manner described in step 4 above.

One of the core samples was substantially fully saturated with a brine solution comprising 2.0 wt % sodium chloride and 98.0 wt % distilled water using the flash saturation technique described in step 5. The saturated core sample was then subjected to NMR analysis employing the procedure of step 6 in conjunction with an IBM PC-20 NMR spectrometer operating with a static field strength of 0.5 Tesla and frequency of 20 MHz. The core sample had to be redrilled to 7/16 inch diameter to fit the spectrometer. The NMR procedure involved application of a single 180° pulse, followed by a predetermined delay time, and then application of a 90° sampling pulse to result in an FID signal having an associated intensity in unitless counts representative of the voltage induced in the receiver coil and also representative of the magnetization component $M_z$. This procedure was repeated for each of the delay times (ranging from 0.075 millisecond to 5000 milliseconds) plotted logarithmically in FIG. 6 to give corresponding magnetization component values in terms of intensity.

The NMR zero time corresponding to the core sample was then obtained in accordance with step 6 by fitting a linear function to the data points of FIG. 6 having positive and negative magnetization component values closest to 0. The resulting function as solved for a magnetization component of 0 gave a delay time t, the NMR zero time, of 31.1 milliseconds.

The residual saturation was determined in accordance with step 8 by employing a calibration function. Such calibration function was obtained by determining residual saturations for each of 17 other core samples, hereafter referred to as calibration core samples, from the borehole core discussed above, along with their corresponding NMR zero times. Residual saturations were determined using the porous plate technique (at 190 psi) in conjunction with the eight step procedure described in step 8. In obtaining the NMR zero times, the general NMR procedure described above was employed, and NMR zero times were determined from linear functions or interpolation. FIG. 7 shows a plot of such NMR zero times (3.37 to 37.74 milliseconds) v. the residual saturation (0.336 to 0.907) as plotted logarithmically. A linear function was fitted to such data by least squares fitting, from which the residual saturation for the core sample of interest was determined to be 38% from the previously determined NMR zero time of 31.1 milliseconds. This result compares favorably with a residual saturation of 34% which was determined conventionally using the porous plate technique.

Conclusion

Thus, there is provided by the present invention an effective method of evaluating the potential productivity of dry hydrocarbons from a zone of a formation, and according to another aspect the method can determine the residual saturation of a porous media with respect to any particular saturating liquid. By means of NMR analysis, the method of the invention is fast (about an hour or less per core sample) and economical, and can avoid expensive production testing of zones of a formation which are predicted by the method to have little or no potential of producing dry hydrocarbons.

Obviously, many modifications of the invention are possible in light of the above teachings. It is, therefore, to be understood that within the scope of the appended claims the invention may be practiced otherwise than as specifically described. For example, the core sample cleaning step could in certain instances be omitted. Or, according to certain broad aspects of the invention, the method could omit the determination of residual saturation, and merely obtain NMR zero times for a number of zones of interest. Those zones having the lowest NMR zero times, generally associated with higher residual saturations, could be selected as having potential for producing dry hydrocarbons.

That which is claimed is:

1. A method of evaluating the potential production characteristics of a zone of a subterranean formation which extends between a first depth and a second depth comprising:
   (a) obtaining at least one sample of the formation from the zone;
   (b) substantially saturating the sample with a saturating liquid comprising water;
   (c) subjecting the thus saturated sample to a static magnetic field, oriented in a first direction and along a reference frame axis, so as to substantially align the nuclear magnetization of the saturating liquid with the static magnetic field;
   (d) subjecting the sample during step (c) to at least one radio frequency pulse, at a resonant frequency with respect to preselected nuclei in the saturating liquid, so as to substantially invert the magnetization of such preselected nuclei to an orientation in a second direction substantially opposite to the first direction;
   (e) detecting, at a predetermined delay time following the radio frequency pulse of step (d), a component of the magnetization of the preselected nuclei which is parallel to the reference frame axis;
   (f) repeating steps (d) and (e) for at least one other delay time;
   (g) determining, from the magnetization component values and corresponding delay times obtained in (e) and (f), the delay time at which the magnetization component is about 0, hereinafter referred to as the NMR zero time; and
   (h) determining if the zone is potentially productive of hydrocarbons which are substantially free of water based on the NMR zero time obtained in step (g).

2. A method as recited in claim 1 further comprising determining the residual saturation from the NMR zero time, and wherein in step (h) such determination of potential productivity is made based on the residual saturation as such residual saturation is based on the NMR zero time.

3. A method as recited in claim 2 wherein the residual saturation is determined from a function relating NMR zero time and residual saturation.

4. A method as recited in claim 3 further comprising the steps of obtaining the function by determining a plurality of residual saturations and NMR zero times for a plurality of samples of the same lithological type as the sample obtained in step (a) and saturated with the same saturating liquid as employed in step (b), and determining the function from such NMR zero times and residual saturations.

5. A method as recited in claim 2 further comprising determining the total saturation associated with the zone and wherein in step (h) such determination of potential productivity is made by comparing the total saturation and the residual saturation, the zone being determined to be potentially productive of hydrocarbons substantially free of water if the residual saturation is greater than or equal to the total saturation.

6. A method as recited in claim 1 wherein in step (d) the radio frequency pulse is a 180° pulse.

7. A method as recited in claim 6 wherein step (e) comprises subjecting the sample to a 90° radio frequency pulse and detecting a free induction decay signal which results therefrom.

8. A method as recited in claim 1 wherein step (g) comprises determining a function relating the magnetization component and delay time from the magnetization component values and corresponding delay times obtained in steps (e) and (f), and determining the NMR zero time from the function.

9. A method as recited in claim 1 wherein the preselected nuclei in the saturating liquid are hydrogen nuclei.

10. A method of determining the residual saturation of a sample of a porous media with respect to a saturating liquid, comprising:
  (a) substantially saturating the sample with the saturating liquid;
  (b) subjecting the thus saturated sample to a static magnetic field, oriented in a first direction and along a reference frame axis, so as to substantially align the nuclear magnetization of the saturating liquid with the static magnetic field;
  (c) subjecting the sample during step (b) to at least one radio frequency pulse, at a resonant frequency with respect to preselected nuclei in the saturating liquid, so as to substantially invert the magnetization of such preselected nuclei to an orientation in a second direction substantially opposite to the first direction;
  (d) detecting, at a predetermined delay time following the radio frequency pulse of step (c), a component of the magnetization of the preselected nuclei which is parallel to the reference frame axis;
  (e) repeating steps (c) and (d) for at least one other delay time;
  (f) determining, from the magnetization component values and corresponding delay times obtained in steps (d) and (e), the delay time at which the magnetization component is about 0, hereinafter referred to as the NMR zero time; and
  (g) determining the residual saturation of the sample with respect to the saturating liquid based on the NMR zero time obtained in step (f).

11. A method as recited in claim 10 wherein in step (g), the residual saturation is determined from a function relating NMR zero time and residual saturation.

12. A method as recited in claim 11 further comprising the steps of obtaining the function by determining a plurality of residual saturations and NMR zero times for a plurality of corresponding samples of the same lithological type as the sample of steps (a)–(c) and saturated with the same saturating liquid as employed in step (a), and determining the function from such residual saturations and NMR zero times.

13. A method as recited in claim 10 wherein in step (c) the radio frequency pulse is a 180° pulse.

14. A method as recited in claim 13 wherein step (d) comprises subjecting the sample to a 90° radio frequency pulse and detecting a free induction decay signal which results therefrom.

15. A method as recited in claim 10 wherein step (f) comprises determining a function relating the magnetization component and delay time from the magnetization component values and corresponding delay times obtained in steps (d) and (e), and determining the NMR zero time from the function.

16. A method as recited in claim 10 wherein the saturating liquid comprises water.

17. A method as recited in claim 16 wherein the preselected nuclei in the saturating liquid are hydrogen nuclei.

* * * * *